United States Patent
Hsiao et al.

(10) Patent No.: US 8,827,695 B2
(45) Date of Patent: Sep. 9, 2014

(54) WAFER'S AMBIANCE CONTROL

(75) Inventors: Yi-Li Hsiao, Hsinchu (TW); Chen-Hua Yu, Hsin-Chu (TW); Jean Wang, Hsin-Chu (TW); Ming-che Ho, Tainan (TW); Chien-Ling Hwang, Hsin-Chu (TW); Jui-Pin Hung, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1084 days.

(21) Appl. No.: 12/435,861

(22) Filed: May 5, 2009

(65) Prior Publication Data
US 2009/0317214 A1    Dec. 24, 2009

Related U.S. Application Data

(60) Provisional application No. 61/074,831, filed on Jun. 23, 2008.

(51) Int. Cl.
*F27D 15/00* (2006.01)
*H01L 21/677* (2006.01)
*H01L 21/67* (2006.01)

(52) U.S. Cl.
CPC .... *H01L 21/67772* (2013.01); *H01L 21/67017* (2013.01); *Y10S 414/135* (2013.01)
USPC .............. 432/86; 414/217; 414/172; 414/935

(58) Field of Classification Search
USPC ...................... 414/217, 172, 935, 939; 432/86
See application file for complete search history.

(56) References Cited

U.S. PATENT DOCUMENTS

| | | | |
|---|---|---|---|
| 5,871,587 A * | 2/1999 | Hasegawa et al. ............ 118/719 |
| 6,364,922 B1 | 4/2002 | Tanaka et al. | |
| 6,591,162 B1 | 7/2003 | Martin | |
| 6,758,876 B2 | 7/2004 | Suzuki et al. | |
| 6,993,405 B2 | 1/2006 | Beaulieu et al. | |
| 7,988,062 B2 * | 8/2011 | Nonaka et al. ................. 236/1 C |
| 2006/0196283 A1 * | 9/2006 | Yang et al. ................... 73/865.9 |
| 2007/0267461 A1 | 11/2007 | Yu et al. | |
| 2007/0269293 A1 | 11/2007 | Yu et al. | |
| 2008/0295412 A1 | 12/2008 | Hsiao et al. | |
| 2008/0298933 A1 | 12/2008 | Hsiao et al. | |

FOREIGN PATENT DOCUMENTS

CN    1933099    7/1995

OTHER PUBLICATIONS

Chinese Patent Office, Office Action mailed Nov. 17, 2010, Application No. 200910150594.3, 5 pages.

* cited by examiner

*Primary Examiner* — Gregory Adams
*Assistant Examiner* — Willie Berry, Jr.
(74) *Attorney, Agent, or Firm* — Haynes and Boone, LLP

(57) ABSTRACT

A semiconductor manufacturing system, an interface system, a carrier, and a method for providing an ambient controlled environment is disclosed. The semiconductor manufacturing system comprises a plurality of process chambers; at least one interface system, wherein the interface system includes a first ambient control element; at least one carrier, wherein the carrier comprises a second ambient control element; and a control module coupled to the plurality of process chambers, the at least one interface system, and the at least one carrier.

20 Claims, 7 Drawing Sheets

WAFER'S AMBIANCE CONTROL

PRIORITY DATA

This application claims priority to Provisional Application Ser. No. 61/074,831 filed on Jun. 23, 2008, entitled "A NOVEL WAFER'S AMBIANCE CONTROL," the entire disclosure of which is incorporated herein by reference.

CROSS-REFERENCE TO RELATED APPLICATIONS

The entire disclosures of the following U.S. Patent Applications related hereto and commonly assigned herewith are hereby incorporated by reference herein:
(1) U.S. Publication No. 2007/0269293 filed on May 23, 2006, entitled "Substrate Carrier and Facility Interface and Apparatus Including Same";
(2) U.S. Publication No. 2007/0267461 filed on May 23, 2006, entitled "Process Apparatuses";
(3) U.S. Publication No. 2008/0295412 filed on May 30, 2007, entitled "Apparatus for Storing Substrates"; and
(4) U.S. Publication No. 2008/0298933 filed on May 29, 2007, entitled "Substrate Carrier, Port Apparatus, and Facility Interface and Apparatus Including Same."

BACKGROUND

Integrated circuit (IC) technologies are constantly being improved. Such improvements frequently involve scaling down device geometries to achieve lower fabrication costs, higher device integration density, higher speeds, and better performance. Along with the advantages from geometry size reductions, improvements to the mechanisms to manufacture and produce integrated circuits are being made.

Semiconductor integrated circuits are produced by a plurality of processes in an integrated circuit fabrication facility. These processes, and associated fabrication tools, may include thermal oxidation, diffusion, ion implantation, RTP (rapid thermal processing), CVD (chemical vapor deposition), PVD (physical vapor deposition), epitaxy, etch, and photolithography. During the fabrication stages, products (e.g., semiconductor substrates) are transported within the fabrication facility and fabrication tools. For example, typically, after a processing step, the substrate is removed from a process chamber that performed the processing step and transferred to a carrier where the substrate is temporarily stored until subsequent processing. During transfer, the substrate is exposed to the surrounding environment, including undesired ambients, such as moisture, oxygen, and airborne molecular contamination. Such exposure often requires a cleaning process to remedy effects in the substrate caused by the undesired ambients.

Accordingly, what is needed is a system and method for providing a protective, ambient controlled environment.

SUMMARY

A semiconductor manufacturing system, an interface system, a carrier, and a method are provided. In one embodiment, an interface system that provides a protective, ambient controlled environment comprises an enclosure and at least one door configured to cover an opening in the enclosure; a robotic system disposed within the enclosure, wherein the robotic system includes at least one holder to support and transfer at least one substrate; at least one first valve coupled to the enclosure for releasing gas into the enclosure; and an ambient control tank and air circulation system coupled to the enclosure.

In one embodiment, a carrier that provides a protective, ambient controlled environment comprises an enclosure and at least one door configured to cover an opening in the enclosure; at least one holder coupled to the enclosure, wherein the at least one holder supports at least one substrate; and at least one ambient control element disposed within the enclosure.

In one embodiment, a semiconductor manufacturing system that provides a protective, ambient controlled environment comprises a plurality of process chambers; at least one interface system, wherein the interface system includes a first ambient control element; at least one carrier, wherein the carrier comprises a second ambient control element; and a control module coupled to the plurality of process chambers, the at least one interface system, and the at least one carrier.

In one embodiment, a semiconductor wafer container providing a protective, ambient controlled environment comprises one or more semiconductor wafers included within the pre-defined structure; and a pre-defined structure including an adsorptive device, wherein the adsorptive device reduces a content of moisture, oxygen, or other residues in the semiconductor wafer container.

In one embodiment, an adsorptive device included in a wafer container, wherein the adsorptive device provides and maintains a protective, ambient controlled environment within the wafer container comprises a shape similar to a wafer and one or more catalysts, wherein the one or more catalysts reduce moisture ambient and/or oxygen ambient content within the wafer container.

In one embodiment, a semiconductor processing system that provides a protective, ambient controlled environment comprises at least one carrier having one or more semiconductor wafers; at least one process chamber; and at least one equipment front end module (EFEM), wherein the EFEM is equipped with an ambiance detector, the ambiance detector operable to monitor the ambiance in the EFEM; wherein the one or more semiconductor wafers are transported within the semiconductor processing system to the at least one carrier, the at least one process chamber, and/or the at least one EFEM during processing.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
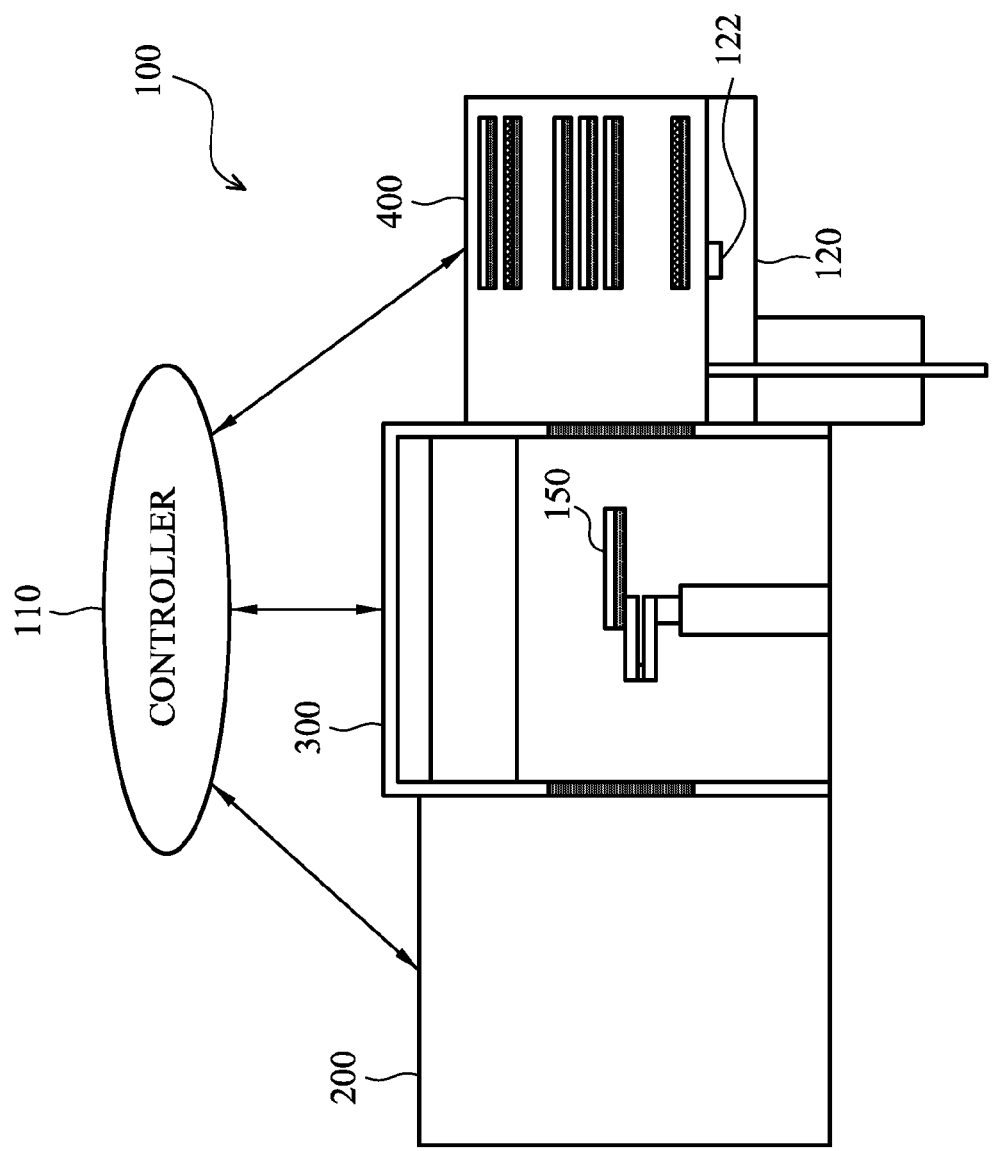
FIG. 1 is a cross-sectional view of a system providing an ambient controlled environment according to one embodiment of the present invention.

The present disclosure relates generally to the field of semiconductor manufacturing systems, and more particularly, semiconductor manufacturing systems that provide an ambient controlled environment.

It is understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

With reference to FIGS. 1 through 6, a semiconductor manufacturing system 100, an interface system 300, a carrier 400, and a method 500 for providing an ambient controlled environment are collectively described below. It is understood that additional features can be added in the system 100, interface system 300, and carrier 400, and some of the features described below can be replaced or eliminated for additional embodiments of the system, interface system, and carrier. It is further understood that additional steps can be provided before, during, and after the method 500 described below, and some of the steps described below can be replaced or eliminated for additional embodiments of the method. The present embodiment of the system 100, interface system 300, carrier 400, and method 500 provides an ambient controlled environment while manufacturing substrates, particularly protecting the substrates from being exposed to undesirable ambients, such as moisture and oxygen.

Referring to FIG. 1, the semiconductor manufacturing system 100 comprises at least one controller 110, a port 120 including a sensor 122, a process chamber 200, the interface system 300 including a first ambient control element, and the carrier chamber 400 including a second ambient control element. It is understood that the semiconductor manufacturing system 100 may comprise any number of controllers 110, ports 120, interface systems 300, and carriers 400.

The semiconductor manufacturing system 100 manufactures and transports at least one substrate 105. The substrate 105 may include a substrate, a wafer, a semiconductor substrate or wafer, a mask, a reticle, a plasma filtering plate, an integrated circuit, an adsorptive pad, any base material on which processing is conducted to produce new film or layers of material, any other suitable substrate for the system 100, and/or combinations thereof. The substrate 105 may further comprise any suitable shape and/or size. In some embodiments, the substrate 105 comprises a 300 mm diameter or a 450 mm diameter.

The controller 110 communicates with the process chamber 200, the interface system 300, and the carrier 400. The controller 110 may further communicate with the port 120. The controller 110 comprises software to implement controlling and has an ability to handle multiple tasks simultaneously and dynamically. The controller 110 can include hardware, including a computer, a network, and/or an interface to bridge communication between the process chamber 200, the interface system 300, the carrier 400, a manufacturing execution system (MES), a computer integrated manufacturing system (CIM), an automatic material handling system (AMHS), a virtual fab, other suitable systems, and/or combinations thereof. As further discussed below, the controller 110 communicates with the interface system 300 and the carrier 400 to facilitate an ambient controlled environment for manufacturing and transporting substrates 105. In some embodiments, the controller 110 may communicate with ambient control sensors (or detectors) coupled to the interface system 300 and the carrier 400 to monitor and maintain levels of various ambients. In the present embodiment, the controller 110 monitors and maintains oxygen and moisture ambients at acceptable levels.

The port 120 including the sensor 122 is disposed proximate to an outer surface of the interface system 300 and proximate to a door of the interface system 300. The port 120 provides support for the carrier 400. The sensor 122 senses when the carrier 400 is disposed (or placed) on the port 120 and ensures that the carrier 400 is properly secured on the port 120. In alternate embodiments, the carrier 400 may be directly coupled to and supported by the plurality of walls of the interface system 300. In some embodiments, the port 120 is a load port, wherein substrate 105 may be transported to and from the carrier 400 placed on the port 120 to the interface system 300.

The semiconductor manufacturing system 100 comprises one or more process chambers 200. Any suitable process may occur within the process chamber 200, such as chemical vapor deposition (CVD), physical vapor deposition (PVD), etching processes (e.g., plasma etching), thermal oxidation, diffusion, ion implantation, chemical mechanical polishing (CMP), rapid thermal annealing (RTA), epitaxy, photolithography, other suitable process, and/or combinations thereof. In some embodiments, the process chamber 200 is a critical process chamber, for example, a dry etch chamber for via opening, a chamber for formation of a copper seed layer, a chamber for copper chemical mechanical polishing, a chamber for formation of low-K dielectric material, a chamber for annealing processes (e.g., nickel annealing), a chamber for a pre-gate clean for oxide growth prior to polysilicon deposition, a chamber for nickel deposition, a chamber for after plasma dry etch, or other chamber that forms or exposes material on the substrate that may react if exposed to the environment. The process chamber 200 may further comprise a furnace. In some embodiments, the process chamber 200 may be a transporting chamber, holding chamber, storing chamber, and/or combinations thereof.

Conventionally, after a processing step within the process chamber 200, the substrate 105 is removed from the process chamber 200 and moved within the semiconductor manufacturing system 100 through the interface system 300 to the carrier 400 for transporting or storing until subsequent processing. As the substrate 105 is moved within the semiconductor processing system 100, the substrate 105 is exposed to the surrounding environment, including undesired ambients, such as moisture and oxygen ambients, and airborne molecular contamination. Such undesired ambients cause undesirable effects in the substrate 105, such that extra processing steps, such as a cleaning process, are used remedy the effects caused in the substrate 105.

In the present embodiment, the semiconductor manufacturing system 100 comprises one or more containers comprising a pre-defined structure for having an ambient control element, which significantly reduces undesired ambients in the surrounding environment. More particularly, the semiconductor manufacturing system 100 comprises one or more containers including a pre-defined structure for having an ambient control element, the interface system 300 including the first ambient control element and the carrier 400 including the second ambient control element. The interface system 300 including the first ambient control element and the carrier 400 including the second ambient control element provide a protective, ambient controlled environment within system 100 for transporting, storing, and manufacturing substrate 105. The first control ambient element, the second control ambient element, and/or any other ambient control element provided in the semiconductor manufacturing system 100 may comprise one or more catalysts (or absorbers), one or more absorber (catalyst) elements, one or more ambient control tanks, one or more adsorptive wafers, one or more adsorptive bags, and/or a combinations thereof, which are described in more detail below. The first control ambient element and the second control ambient element provide ambient control within the semiconductor manufacturing system 100.

Figure 2:
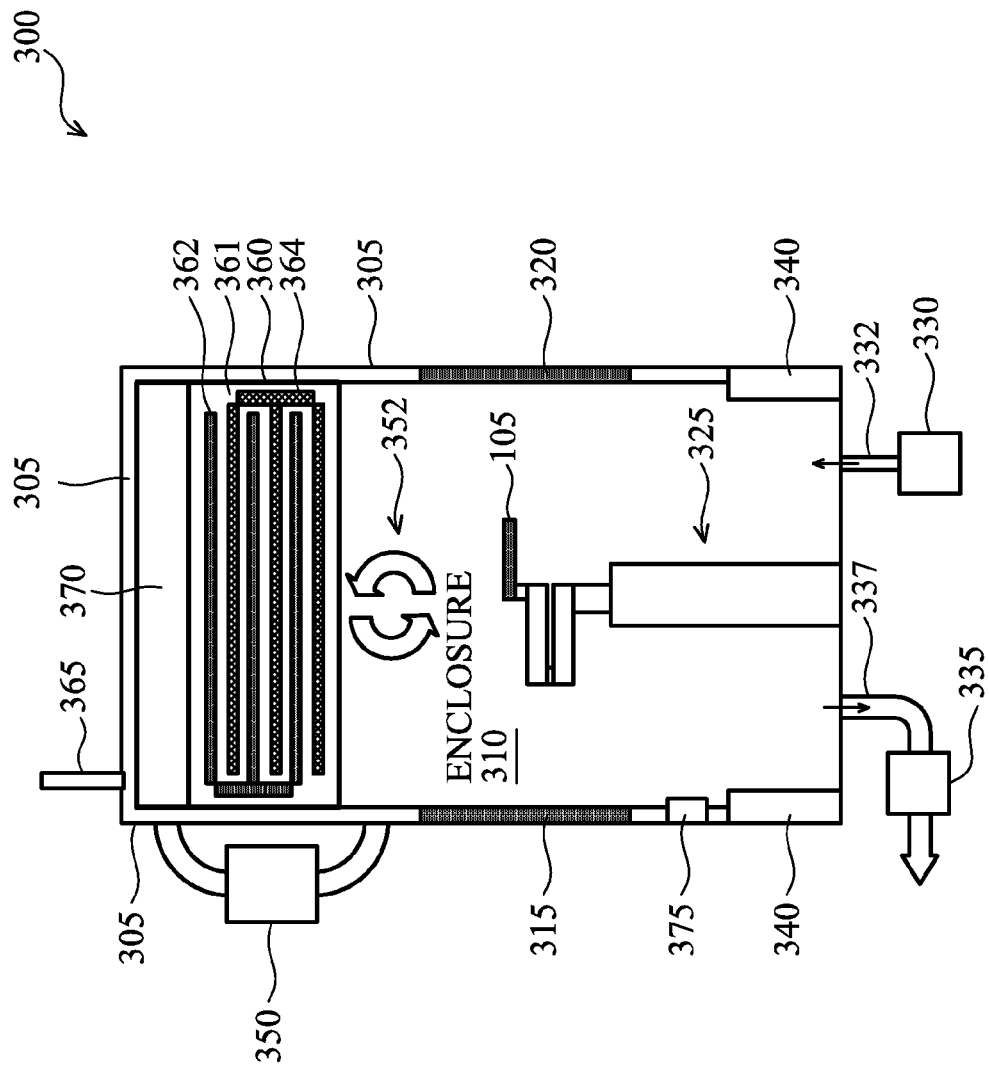
FIG. 2 is a cross-sectional view of an interface system within a system providing an ambient controlled environment according to one embodiment of the present invention.

The semiconductor manufacturing system 100 includes the interface system 300 including the first ambient control element. The interface system 300 including the first ambient control element provides an ambient controlled environment while transporting (or transferring) the substrate 105 between the process chamber 200 and the carrier 400. FIG. 2 provides the interface system 300 comprising a first ambient control element according to one embodiment. The interface system 300 comprises a plurality of walls 305; an enclosure 310; a set of doors 315, 320; a robotic system 325; a gas providing system 330; an exhaust system 335; a heating element 340; an air circulation system 350 providing air circulation 352; an ambient control tank 360 including an absorber (catalyst) element 361, a regeneration element 362, and a cooling element 364; an outlet system 365; a particle filter 370; and an ambient control sensor (or detector) 375. In the present embodiment, the first ambient control element comprises the circulation system 350 providing air circulation 352; the ambient control tank 360 including the absorber (catalyst) element 361, regeneration element 362, and the cooling element 364; the particle filter 365; and the outlet system 370. The first ambient control element may comprise any of these elements alone or in combination in alternate embodiments. In some embodiments, the interface system 300 may be a facility interface. In some embodiments, the interface system 300 may comprise an equipment front end module (EFEM).

The plurality of walls 305 creates enclosure 310, providing a protective, ambient controlled environment for transferring the substrate 105. The set of doors 315, 320 may be on or in at least one of the plurality of walls 305. The door 315 facilitates transporting the substrate 105 between the interface system 300 and the process chamber 200. The door 320 facilitates transporting the substrate 105 between the interface system 300 and the carrier 400.

At least one robotic system 325 is disposed within the enclosure 310. The robotic system 325 operates to transfer the substrate 105 between the process chamber 200 or carrier 400 and the interface system 300 through the doors 315, 320. The robotic system 325 transfers substrates from the carrier 400 and within the interface system 300 to various process chambers 200, or from the various process chambers 200 and within the interface system 300 to the carrier 400. Alternate embodiments may comprise multiple robotic systems 325. Further, the locations where the robotic system 325 transports substrates are not limited by the present embodiment.

The interface system 300 may include the gas providing system 330, the exhaust system 335, and the heating element 340. The gas providing system 330 is coupled to the enclosure 310. In the present embodiment, the gas providing system 330 is disposed at the bottom region of the enclosure 310; however, it is understood that in alternate embodiments the gas providing system 330 may be disposed at the top region and/or side regions of the enclosure 310. The gas providing system 330 provides a gas to the enclosure 310 through tube (or pipeline) 332. The provided gas may include any suitable gas, such as hot nitrogen ($N_2$), hydrogen ($H_2$), helium (He), argon (Ar), an inert gas, any other suitable gas, and/or combinations thereof. In some embodiments, the gas providing system 330 may comprise a gas cabinet, any other apparatus that is appropriate to provide gas to the enclosure 310, and/or combinations thereof.

The exhaust system 335 is coupled to the enclosure 310. In the present embodiment, the exhaust system 335 is disposed at the bottom region of the enclosure 310; however, it is understood that in alternate embodiments the exhaust system 335 may be disposed at the top region and/or side regions of the enclosure 310. The exhaust system 335 removes (or exhausts) gas from the enclosure 310 through tube (or pipeline) 337. The removed gas may include gas pumped into the enclosure 310 by gas providing system 330, air, moisture, oxygen, airborne molecular contamination (AMC), or any other suitable gas. In some embodiments, the exhaust system 335 may comprise a pump, a vacuum system, an engine, a motor, other apparatus adequate to remove a gas from the enclosure 310, and/or combinations thereof.

The gas providing system 330 and the exhaust system 335 may operate simultaneously or separately. The gas providing system 330 and the exhaust system 335 efficiently remove undesired ambients, particularly moisture and oxygen, from the enclosure 310 while the substrate 105 is stored within.

The heating element 340 further facilitates removing ambients, such as moisture and oxygen, from the enclosure 310. One or more heating elements 340 may be disposed within enclosure 310 on or in the plurality of walls 305. In the present embodiment, two heating elements 340 are disposed within enclosure 310, one on each side wall; however, it is understood that the relative position of the heating element(s) 340 is not limited by the configuration illustrated in the present embodiment. The heating element 340 increases the efficiency of the interface system 300 to remove undesired ambients.

Typically, the gas provider system 330 and exhaust system 335 efficiently protect the substrate 105 from exposure to undesired ambients. However, the gas provider system 330 and exhaust system 335 have been unable to maintain moisture and oxygen ambients at acceptable levels. The present embodiment provides the ability to reduce the moisture and oxygen levels to below 1%, reducing the moisture and oxygen ambients to parts per million (ppm) levels. The circulation system 350 providing air circulation 352; the ambient control tank 360 including the absorber (catalyst) element 361, regeneration element 362, and the cooling element 364; the particle filter 365, and the outlet system 370, alone or in combination, provide the first ambient control element, which effectively removes the undesired moisture and oxygen ambients from within enclosure 310 and maintains the removal (or an acceptable level) of such ambients at ppm levels.

The air circulation system 350 may comprise a fan or any other suitable apparatus that provides air circulation 352 within the enclosure 310. In the present embodiment, the air circulation system 350 providing air circulation 352 is turned on after the majority of the oxygen and moisture ambients are removed. For example, the air circulation system 350 may be activated when the moisture and oxygen ambient levels reach 1%. The air circulation system 350 provides air circulation 352 within the enclosure 310 and to the ambient control tank 360. The air circulation 352 facilitates reducing the residual oxygen and moisture ambients to ppm levels.

The ambient control tank 360 is coupled to the enclosure 310. In the present embodiment, the ambient control tank 360 is disposed at the top region of the enclosure 310; however, it is understood that in alternate embodiments the ambient control tank 360 may be disposed at the bottom region and/or side regions of the enclosure 310. The ambient control tank 360 comprises the absorber (catalyst) element 361. The absorber (catalyst) element 361 comprises one or more catalysts (or absorbers) that significantly reduce the amount of oxygen and moisture ambients present within enclosure 310 and further decrease the time required to reduce such oxygen and moisture ambients. The catalysts or absorbers may comprise any suitable catalyst or absorber. For example, for reducing moisture ambients, the catalyst may comprise $Na_{86}[AlO_2)_{86}(SiO_2)_{106}].*H_2O$; and for reducing oxygen ambients, the catalyst may comprise a copper or graphite catalyst. In some embodiments, the catalysts may comprise catalysts for reducing moisture ambients, catalysts for reducing oxygen ambients, and/or a combination of catalysts for reducing moisture and oxygen ambients.

The ambient control tank 360 may function in a regeneration mode or an adsorption mode. The regeneration element 362 and the cooling element 364 facilitate such modes. The cooling element 364 facilitates the adsorption mode and may be turned on to enhance the absorbability of the absorber (catalyst) element 361 in the ambient control tank 360. The regeneration element 362 facilitates the regeneration mode and may be turned on when the catalysts of the absorber (catalyst) element 361 in the ambient control tank 360 are saturated. The regeneration element 362 renews the catalysts by providing heat. For example, the regeneration element 362 may regenerate the catalysts by heating up to 250° C. Further, the regeneration element 362 may provide a regeneration gas, such as hot nitrogen ($N_2$) and/or hydrogen ($H_2$), to renew the catalysts. The ambient control tank 360 may further be coupled to the outlet system 365 and the particle filter 370, which further provide a mechanism for effectively purging out the oxygen ambients, moisture ambients, AMC, and other undesired particles that may detrimentally effect the substrates (or wafers) stored within the enclosure 310.

Generally, in some examples, the interface system 300 is pre-cleaned, purged to remove moisture and oxygen ambient levels to below 1% (e.g., by gas provider system 330), and then, the interface system 300 is sealed off where the ambient control element (e.g., ambient control tank 360) is provided to further reduce the moisture and oxygen ambient levels and/or maintain the moisture and oxygen ambient levels below 1% (essentially, maintaining the moisture and oxygen ambients to ppm levels).

In the present embodiment, one ambient control tank 360 is provided. It is understood that in alternate embodiments multiple ambient control tanks 360 may be included within the interface system 300. For example, the interface system 300 may comprise two ambient control tanks 360 so that the regeneration mode and adsorption mode may occur simultaneously (i.e., while catalysts of one absorber (catalyst) element 361 are adsorbing, other catalysts of another absorber (catalyst) element 361 are being regenerated). This capability significantly reduces maintenance time.

The interface system 300 may further comprise the ambient control sensor 375. The ambient control sensor 375 may also be referred to as an ambient control detector. The ambient control sensor 375 may be disposed in or on one of the plurality of walls 305 within enclosure 310. The ambient control sensor 375 identifies the conditions of the enclosure 310 and monitors the moisture, oxygen, and AMC levels within enclosure 310. In some embodiments, the ambient control sensor 375 may monitor other ambient levels that are controlled to maintain a protective environment for the substrate 105. In some embodiments, the ambient control sensor 375 may monitor the pressure levels within the enclosure 310. The ambient control sensor 375 may communicate with the controller 110. In some embodiments, the ambient control sensor 375 communicates the levels of undesired ambients to the controller 110. Accordingly, the controller 110 monitors when the enclosure 310 reaches undesirable amounts of oxygen, moisture, AMC, other ambients, and/or combinations thereof, enabling the controller 110 to trigger the regeneration mode and/or adsorption mode so that the ambient levels may be returned to acceptable levels. For example, in some embodiments, based on information and signals received from the ambient control sensor 375, the controller 110 determines when a regeneration mode or an adsorbent mode should be initiated. By communicating with the ambient control sensor (or detector) 375, the controller 110 can effectively control the undesired ambient levels within the interface system 300, such as the moisture and oxygen ambient levels, maintaining such undesired ambients at acceptable levels.

It is understood that, in some embodiments, the interface system 300 may include a display device. The display device may include a LCD display and/or a LED display. It is further understood that the interface system 300 may comprise an ambient resistant (or barrier) material. For example, the interface system 300 may comprise a coating of the ambient resistant material over one or more of the exterior and/or interior surfaces. The ambient resistant material may comprise a moisture resistant, oxygen resistant, AMC resistant, other suitable ambient resistant material, and/or combinations thereof.

Figure 3A:
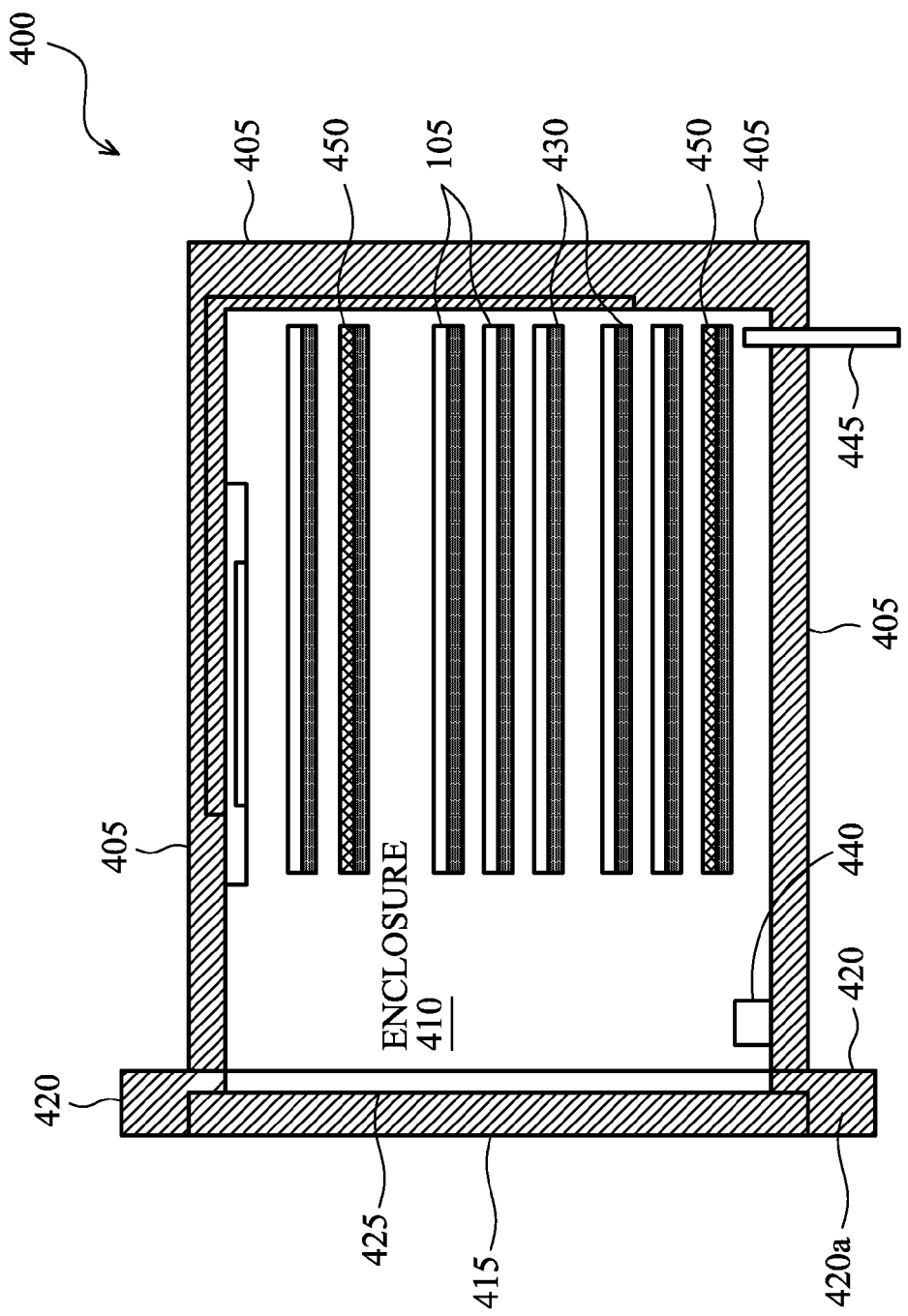
FIG. 3A is a cross-sectional view of a carrier within a system providing an ambient controlled environment according to one embodiment of the present invention.

The semiconductor manufacturing system 100 further comprises the carrier 400 including the second ambient control element. The carrier 400 including the second ambient control element provides an ambient controlled environment while storing, transporting, or holding the substrates 105. FIG. 3A provides the carrier 400 including the second ambient control element according to one embodiment. The carrier 400 comprises semiconductor substrates 105, a plurality of walls 405, an enclosure 410, a door 415, a frame 420, a sealing apparatus 425, substrate holders 430, an ambient control sensor (or detector) 440, a gas providing system 445, and adsorptive pads 450. In the present embodiment, the second ambient control element comprises the adsorptive pads 450.

The carrier 400 may be a cassette, front opening unified pod (FOUP), standard mechanical interface (SMIF), reticle carrier, or any other suitable carrier for carrying one or more semiconductor substrates 105. The plurality of walls 405 create enclosure 410, providing a protective, ambient controlled environment for holding and transporting the semiconductor substrates 105. In the present embodiment, the carrier 400 is a FOUP, and the door 415 is located on a side of the carrier 400. The door 415 also includes a frame 420 so that the door 415 can be moved into and from the frame 420. In alternate embodiments, the carrier 400 may be a cassette or SMIF with the door 415 located at the bottom of the carrier 400.

One or more substrate holders 430 are disposed within enclosure 410 to provide support to the substrates 105. The substrate holders 430 may be coupled to at least one of the plurality of walls 405. The substrate holders 430 may comprise plates, small extrusions on or grooves within the plurality of walls 405, other suitable structures capable of holding the substrates 105, and/or combinations thereof.

The carrier 400 may further comprise the ambient control sensor 440. The ambient control sensor 440 may also be referred to as an ambient control detector. The ambient control sensor 440 may be disposed in or on one of the plurality of walls 405 within enclosure 410. The ambient control sensor 440 monitors the conditions of the enclosure 410 and monitors the moisture, oxygen, and AMC levels within enclosure 410. In some embodiments, the ambient control sensor 440 may monitor other ambient levels that need to be controlled to maintain a protective environment for the substrates 105. In some embodiments, the ambient control sensor 440 may monitor the pressure levels within the enclosure 410.

The ambient control sensor 440 may communicate with the controller 110. In some embodiments, the ambient control sensor 440 communicates the levels of undesired ambients to the controller 110. Accordingly, the controller 110 monitors when the enclosure 410 reaches undesirable amounts of oxygen, moisture, AMC, other ambients, and/or combinations thereof, enabling the controller 110 to trigger a purge mode and/or adsorption mode so that the ambient levels may be returned to acceptable levels. For example, in some embodiments, based on information and signals received from the ambient control sensor 440, the controller 110 determines when a purging mode or an adsorption mode should be initiated. By communicating with the ambient control sensor 440, the controller 110 can effectively control the undesired ambient levels within the interface system 400, such as the moisture and oxygen ambient levels, maintaining such undesired ambients at acceptable levels The carrier 400 may include the gas providing system 445. The gas providing system 445 is coupled to the enclosure 410. In the present embodiment, the gas providing system 445 is disposed at the bottom region of the enclosure 410; however, it is understood that in alternate embodiments the gas providing system 440 may be disposed at the top region and/or side regions of the enclosure 410. The gas providing system 445 provides a gas to the enclosure 410 through a tube (or pipeline). The provided gas may include any suitable gas, such as hot nitrogen ($N_2$), hydrogen ($H_2$), helium (He), argon (Ar), an inert gas, any other suitable gas, and/or combinations thereof. In some embodiments, the gas providing system 445 may comprise a gas cabinet, any other apparatus that is appropriate to provide gas to the enclosure 410, and/or combinations thereof. In some embodiments, the carrier 400 may further include an exhaust system coupled to the enclosure 410 for removing (or exhausting) gas from the enclosure 410. The removed gas may include gas pumped into the enclosure 410 by gas providing system 445, air, moisture, oxygen, airborne molecular contamination (AMC), or any other suitable gas. In some embodiments, the exhaust system may comprise a pump, a vacuum system, an engine, a motor, other apparatus adequate to remove a gas from the enclosure 410, and/or combinations thereof. The gas providing system 445 (and the exhaust system) efficiently remove undesired ambients, particularly moisture and oxygen, from the enclosure 410 while the substrates 105 are stored within.

It is understood that, in some embodiments, the carrier 400 may include a display device. The display device may include a LCD display and/or a LED display. It is further understood that the carrier 400 may comprise an ambient resistant (or barrier) material. For example, the carrier 400 may comprise a coating of the ambient resistant material over one or more of the exterior and/or interior surfaces. The ambient resistant material may comprise a moisture resistant, oxygen resistant, AMC resistant, other suitable ambient resistant material, and/or combinations thereof.

Typically, the gas providing system 445 efficiently protects the substrates 105 from exposure to undesired ambients. In some embodiments, the gas providing system 445 may be unable to maintain moisture and oxygen ambients at acceptable levels. The present embodiment of the carrier 400 includes the second ambient control element, the adsorptive pads 450, and provides the ability to reduce the moisture and oxygen levels to below 1 to 2%, reducing the moisture and oxygen ambients to parts per million (ppm) levels. The adsorptive pads 450 effectively remove the undesired moisture and oxygen ambients from within enclosure 410 and maintain the removal (or an acceptable level) of such ambients at ppm levels. For example, the carrier 400 is pre-cleaned, purged to remove moisture and oxygen ambients to levels below 1% (e.g., by gas providing system 445), and then, the carrier 400 is capped in the system where the adsorptive pads 450 may be provided in the carrier 400 to maintain the moisture and oxygen ambient levels below 1% (essentially, maintaining the moisture and oxygen ambients to ppm levels).

The second ambient control element can include the one or more adsorptive pads 450 disposed within the enclosure 410 of carrier 400. The adsorptive pads 450 may comprise any shape. In the present embodiment, the adsorptive pads 450 comprise a semiconductor wafer shape so that the substrate holders 430 can easily support the adsorptive pads 450 and the adsorptive pads can easily be exchanged within the carrier 400. In some embodiments, the adsorptive pads 450 may comprise a 300 mm diameter wafer shape and/or a 450 mm diameter wafer shape. The adsorptive pads 450 may comprise a meshed structure, a reticular structure, a porous structure, other suitable structure material, and/or combinations thereof. The adsorptive pads further comprise catalysts (or absorbers). The catalysts significantly reduce the amount of oxygen and moisture ambients present within enclosure 410 and further decrease the time required to reduce such oxygen and moisture ambients. The adsorptive pads 450 can adsorb moisture ambients, oxygen ambients, AMC, other undesirable ambients, and/or combinations thereof. The catalysts or absorbers may comprise any suitable catalyst or absorber. For example, for reducing moisture ambients, the catalyst may comprise $Na_{86}[AlO_2]_{86}(SiO_2)_{106}].*H_2O$; and for reducing oxygen ambients, the catalyst may comprise a copper or graphite catalyst. In some embodiments, the catalysts may comprise catalysts for reducing moisture ambients, catalysts for reducing oxygen ambients, and/or a combination of catalysts for reducing moisture and oxygen ambients.

When the adsorptive pads 450 are saturated, the adsorptive pads may be regenerated within enclosure 410 and/or the adsorptive pads may be replaced with new unsaturated adsorptive pads. If the adsorptive pads 450 are regenerated within enclosure 410, then a regeneration gas in introduced within enclosure 410 (for example, the regeneration gas may be provided by the gas providing system 445). The regeneration gas may include any suitable gas, such as hot nitrogen ($N_2$), hydrogen ($H_2$), helium (He), argon (Ar), an inert gas, any other suitable gas, and/or combinations thereof. The regeneration gases effectively regenerate the catalysts so that the catalysts continue to adsorb undesired ambients such as moisture and oxygen. If the adsorptive pads 450 are replaced, the saturated adsorptive pads are transferred to a recycle chamber for recharge, and new, unsaturated adsorptive pads are transferred into the chamber 400.

Figure 4:
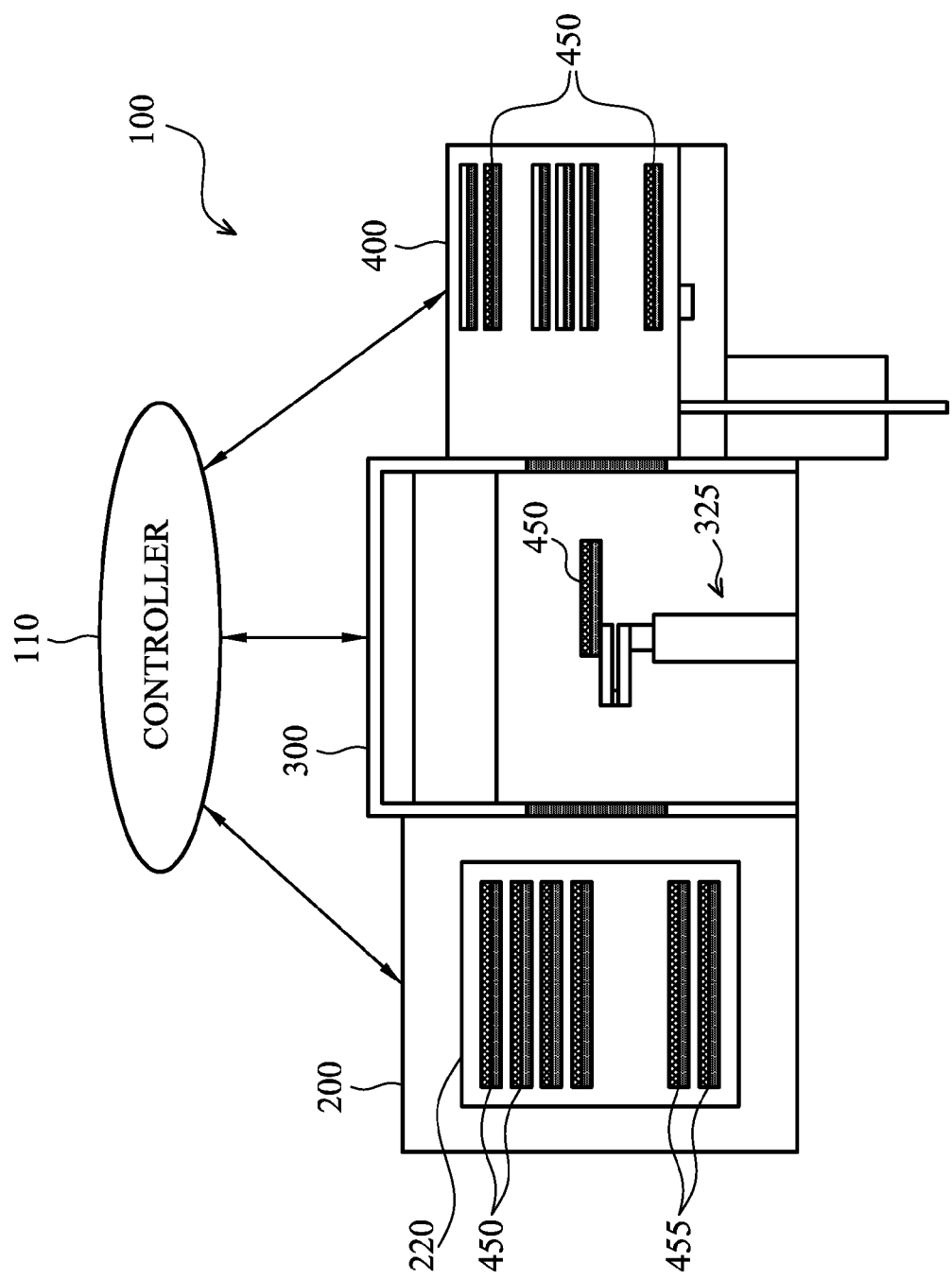
FIG. 4 is a cross-sectional view of a recycle chamber within a system providing an ambient controlled environment according to one embodiment of the present invention.

FIG. 4 provides a recycle chamber 220 according to one embodiment. The recycle chamber 220 essentially functions as a process chamber 200 in the semiconductor manufacturing system 100. The recycle chamber 220 comprises a plurality of adsorptive pads 450 and adsorptive pad holders 455. In the carrier 400, when the adsorptive pad 450 is saturated, the saturated adsorptive pad is transferred through the interface system 300 by the robotic system 325 from the carrier 400 to the recycle chamber 220, and the saturated adsorptive pad is placed within the recycle chamber 220 on the adsorptive pad holder 455 for recharging. Then, an unsaturated adsorptive pad 450 is removed from the recycle chamber 220 and is transferred through the interface system 300 by the robotic system 325 from the recycle chamber 220 to the carrier 400. In some embodiments, the semiconductor manufacturing system comprises two recycle chambers 220, one for receiving saturated adsorptive pads and one for providing recycled adsorptive pads.

The recycle chamber 220 facilitates regenerating, recharging, and recycling saturated adsorptive pads. The recycle chamber 220 may comprise a gas providing system, an exhaust system, a heating element, any other suitable catalyst regeneration element, and/or combinations thereof. In some embodiments, the gas providing system may be coupled to the recycle chamber 220. The gas providing system may provide a gas within the recycle chamber 220, such as hot nitrogen ($N_2$), hydrogen ($H_2$), helium (He), argon (Ar), an inert gas, any other suitable gas, and/or combinations thereof. In some embodiments, the gas providing system may comprise a gas cabinet, any other apparatus that is appropriate to provide gas to the recycle chamber 220, and/or combinations thereof. In some embodiments, the exhaust system may be coupled to the recycle chamber 220 for removing gas pumped into the recycle chamber 220. The exhaust system may also remove ambients within the recycle chamber 220, such as air, moisture, oxygen, AMC, other suitable ambients, and/or combinations thereof. In some embodiments, the exhaust system comprises a pump, a vacuum system, an engine, a motor, other apparatus adequate to remove a gas from the recycle chamber 220, and/or combinations thereof. In some embodiments, one or more heating elements may be disposed within the recycle chamber 220. In one embodiment, the heating element may heat the recycle chamber to 250° C. for regenerating (and recharging) the unsaturated adsorptive pads.

Figure 3B:
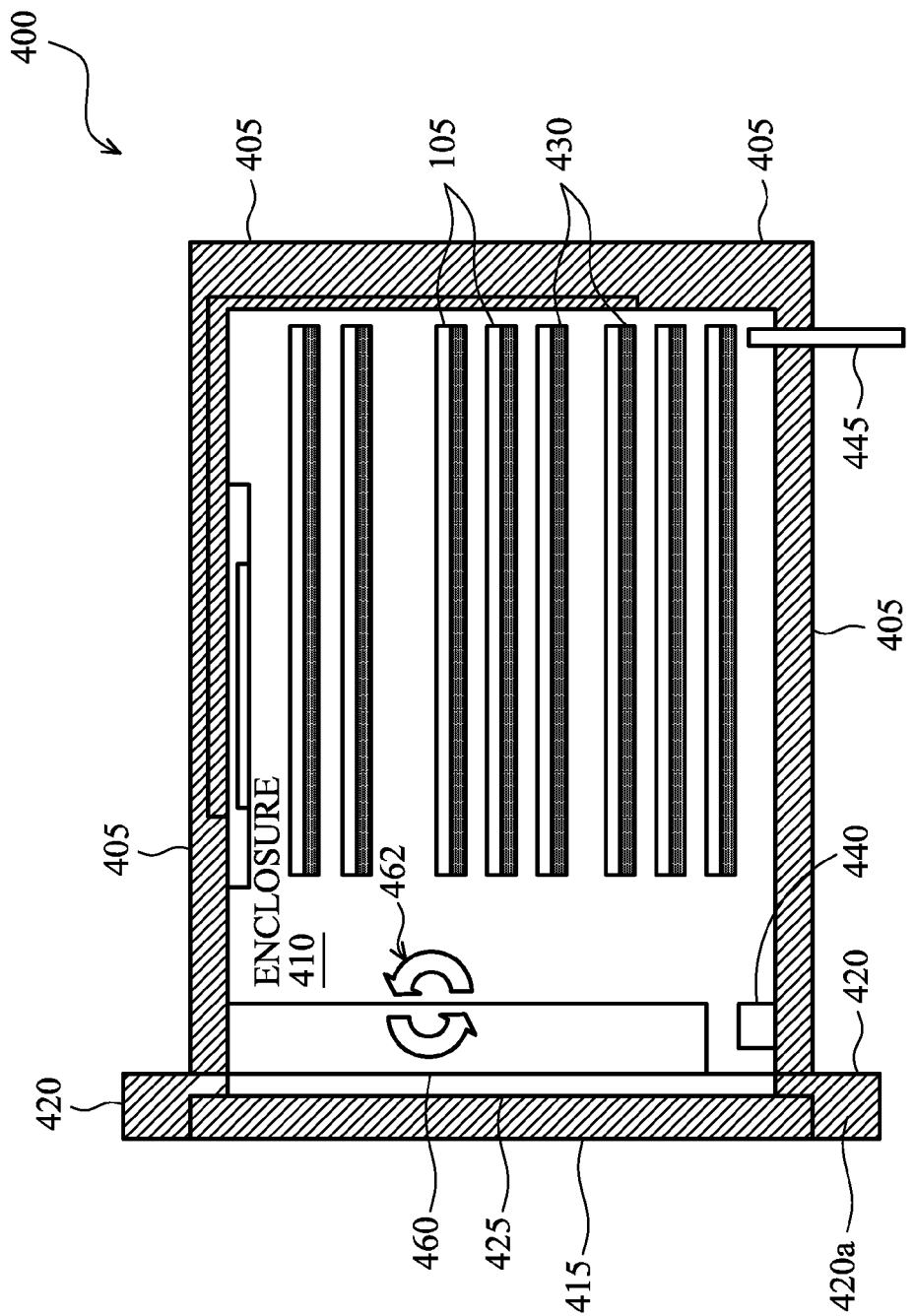
FIG. 3B is a cross-sectional view of a carrier within a system providing an ambient controlled environment according to one embodiment of the present invention.

FIG. 3B provides the carrier 400 including the second ambient control element according to another embodiment. FIG. 3B illustrates the carrier 400 of FIG. 3A; however, instead of the carrier 400 comprising adsorptive pads 450, the carrier 400 comprises an ambient control bag 460 and an air circulation element 462 providing air circulation. In the present embodiment, the second ambient control element comprises the ambient control bag 460 and the air circulation element 462 that provides air circulation. In alternate embodiments, the second ambient control element may comprise only the ambient control bag 460 or only the air circulation element 462 that provides air circulation. It is understood that in alternate embodiments, the carrier 400 may comprise a combination of adsorptive pads 450, the ambient control bag 460, and/or the air circulation element 462 providing air circulation.

The ambient control bag 460 is coupled to the enclosure 410. In the present embodiment, the ambient control bag 460 is disposed on or in one of the plurality of walls 405 and/or the door 415; however, it is understood that in alternate embodiments the ambient control bag 460 may be disposed at the bottom region, top region, and/or other side regions of the enclosure 410. The ambient control bag 460 comprises catalysts (or absorbers). The catalysts significantly reduce the amount of oxygen and moisture ambients present within enclosure 410 and further decrease the time required to reduce such oxygen and moisture ambients. The catalysts or absorbers may comprise any suitable catalyst or absorber. For example, for reducing moisture ambients, the catalyst may comprise $Na_{86}[AlO_2]_{86}(SiO_2)_{106}].*H_2O$; and for reducing oxygen ambients, the catalyst may comprise a copper or graphite catalyst. In some embodiments, the catalysts may comprise catalysts for reducing moisture ambients, catalysts for reducing oxygen ambients, and/or a combination of catalysts for reducing moisture and oxygen ambients.

The air circulation element 462 may comprise a fan or any other suitable apparatus that provides air circulation within the enclosure 410 and to the ambient control bag 460. In the present embodiment, the air circulation element 462 provides air circulation after the majority of the oxygen and moisture ambients are removed. For example, the air circulation element 462 providing air circulation may be activated when the moisture and oxygen ambient levels reach 1%.

Figure 5:
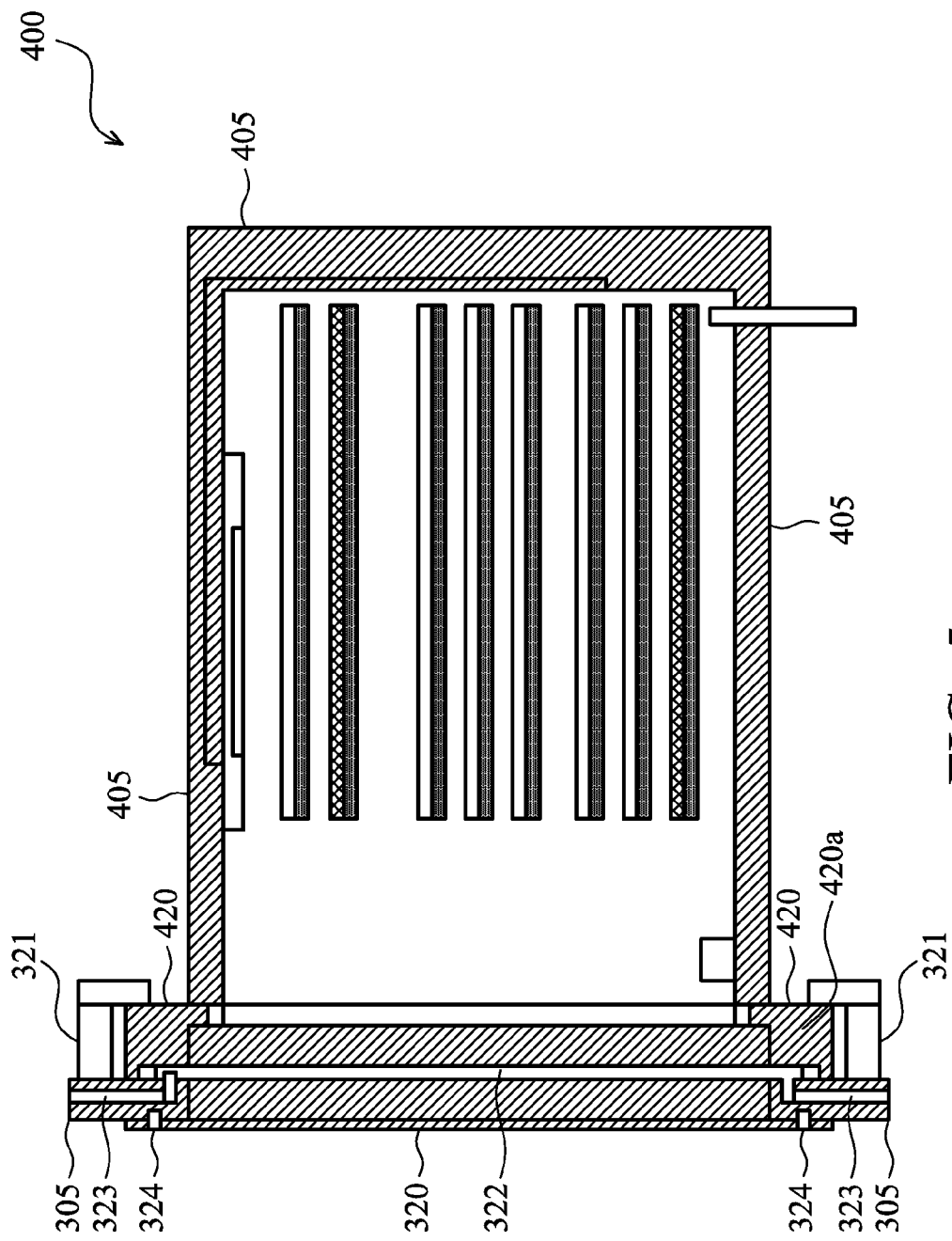
FIG. 5 is a cross-sectional view of an interface between an interface system and a carrier within a system providing an ambient controlled environment according to one embodiment of the present invention.
Figure 6:
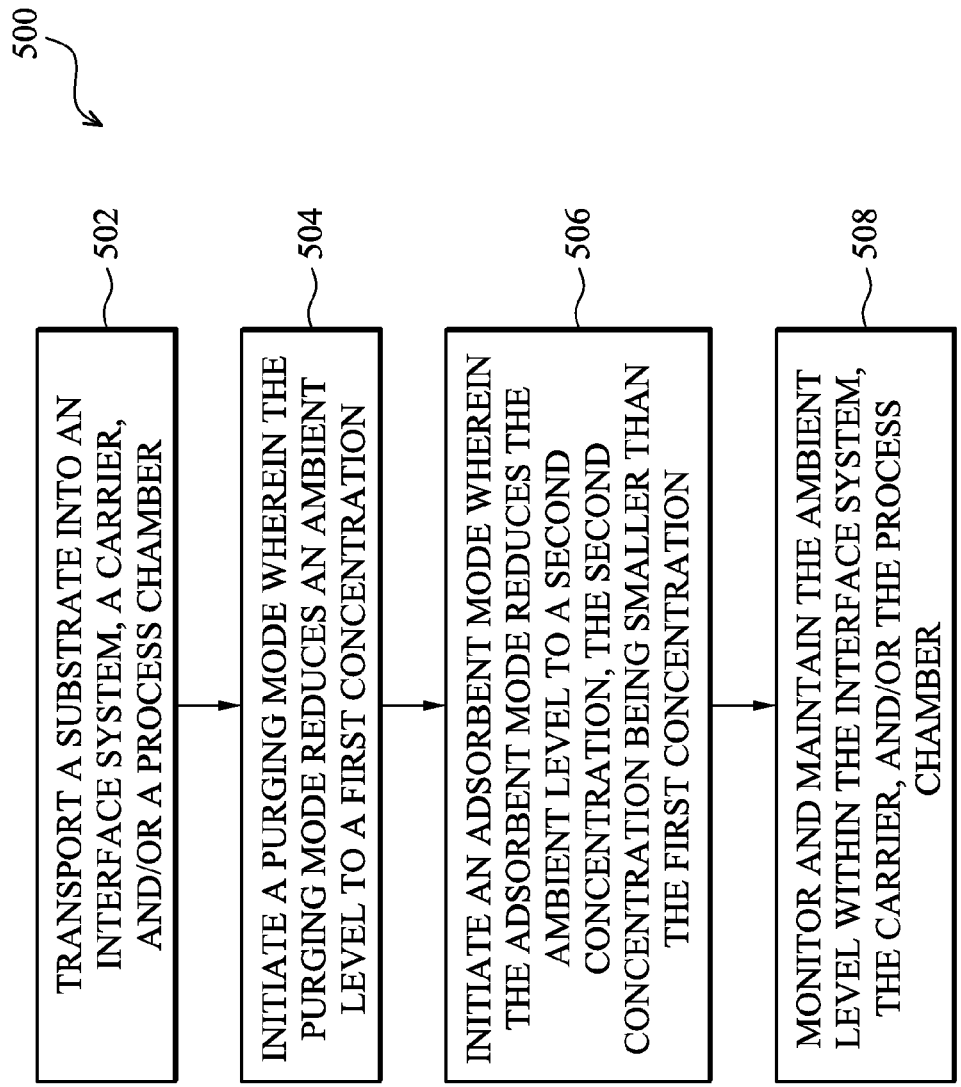
FIG. 6 is a flow chart of a method for providing an ambient controlled environment within a system according to one embodiment of the present invention.

The semiconductor manufacturing system 100 further provides an ambient controlled environment within the interface between the interface system 300 and the carrier 400 so that the substrates 105 are not exposed to undesirable ambients while transferred between open door 320 of the interface system 300 and open door 415 of the carrier 400. Referring to FIG. 5, the undesired ambients between the interface system 300 and the carrier 400 are purged when the interface system 300 is coupled to the carrier 400. In the present embodiment, the carrier 400 is attached to one of the plurality of walls 305 of the interface system 300. In the present embodiment, the plurality of walls 305 includes the door 320, at least one fastener 321, a first sealing apparatus 322, at least one valve 323, and a second sealing apparatus 324.

When the interface system 300 and the carrier 400 are attached, the door of the interface system 320 and the door of the carrier 415 are coupled together. The at least one fastener 321 fastens the carrier 400 to the interface system 300. The at least one fastener 321 may comprise a clamp, a knob clamp, a clip, other devices that may fasten the carrier 400 to the interface system 400. The at least one fastener 321 may rotate or move horizontally and/or vertically. Further, it is understood that any number of fasteners 321 may be utilized.

The first sealing apparatus 322 seals the region between the wall 305 including the door 320 and the door 415 once the interface system 300 and the carrier 400 are attached. The second sealing apparatus 324 is disposed between the wall 305 and the door 320 to tightly seal the enclosure 305 of the interface system 300. The first sealing apparatus 322 and the second sealing apparatus 324 may include a rubber strip, an O-ring, gel, any other apparatus adapted to seal the region, and/or combinations thereof.

The at least one valve 323 may comprise valves for removing ambients and valves for providing gas. In the present embodiment, at least one valve 323 removes ambients, such as air, moisture, and oxygen, trapped within the interface region, and at least one valve 323 provides a gas or mixture of gas within the interface region. Purging the region between the door 320 of the interface system 300 and the door 415 of the carrier 400 enhances the ambient controlled environment within the semiconductor manufacturing system 100, allowing substrates 105 to be transferred between the interface system 300 and the carrier 400 without exposure to undesired ambients.

The semiconductor manufacturing system 100 may utilize the method 500 while transporting and manufacturing the substrates 105. Referring to FIGS. 1 through 6, the method 500 begins with step 502, which involves providing the process chamber 200, the interface system 300, and/or the carrier 400. At step 504, a purging mode is initiated by the controller 110. The purging mode includes injecting the interface system 300 or the carrier 400 with any suitable gas, such as hot nitrogen ($N_2$), hydrogen ($H_2$), helium (He), argon (Ar), an inert gas, any other suitable gas, and/or combinations thereof. The purging mode purges the interface system 300 or the carrier 400 of the undesired ambients, such as oxygen, moisture, AMC, and/or combinations thereof. The purging mode may further include a process vacuum, heating the walls of the interface system 300 or the carrier 400, any other suitable mechanisms for reducing undesired ambients, and/or combinations thereof.

The purging mode reduces an ambient level of the interface system 300 or the carrier 400 to a predetermined point where the purging mode is switched to an adsorbent mode. The point may represent a predetermined level/concentration of oxygen ambients, moisture ambients, AMC, other undesired ambients, and/or combinations thereof. For example, in some embodiments, the purging mode reduces the ambient level (content) to a first concentration. When the predetermined point (e.g., the first concentration) is reached, at step 506, the adsorbent mode is initiated. In some embodiments, the controller 110 initiates the adsorbent mode. Initiating the adsorbent mode in interface system 300 involves activating the circulation system 350 providing air circulation 352, the ambient control tank 360 including the regeneration element 362 and the cooling element 364, the particle filter 365, and the outlet system 370, alone or in combination. Initiating the adsorbent mode in the carrier 400 involves activating the adsorptive pads 450, ambient control bag 460, and air circulation element 462, alone or in combination. The adsorbent mode can reduce the ambient level (content) to a second concentration, wherein the second concentration is lower than the first concentration. Further, in some embodiments, the adsorbent mode maintains the ambient level (content) at the first concentration achieved by the purging mode.

Once the undesired ambient levels are reduced to an acceptable level, at step 508, the ambient level (content) is monitored within the interface system 300, the carrier 400, and/or the process chamber 200. For example, the controller 110 may continue to monitor the interface system 300, the carrier 400, and/or the process chamber 200 to maintain acceptable levels of the undesired ambients (e.g., by communicating with the ambient control sensors (or detectors)). Depending on the undesired ambient levels, the controller 110 may again initiate the purging mode or the adsorbent mode. When the ambient levels are at acceptable levels, at step 510, a substrate (e.g., substrate 105) may be transported into the interface system 300, the carrier 400, and/or the process chamber 200. It is understood that the ambient level (content) may still be monitored while the substrate 105 is within the interface system 300, the carrier 400, and/or the process chamber 200. This method effectively maintains a protective, ambient controlled environment while the substrate 105 is being manufactured and transported within the semiconductor manufacturing system 100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An interface system that provides a protective, ambient controlled environment, the interface system comprising:
    an enclosure and at least one door configured to cover an opening in the enclosure;
    a robotic system disposed within the enclosure, wherein the robotic system includes at least one holder to support and transfer at least one substrate;
    at least one first valve coupled to the enclosure for releasing gas into the enclosure; and
    an ambient control element including an ambient control tank and air circulation system coupled to the enclosure, wherein the ambient control element is operable to control at least one of an oxygen level, a moisture level, and an airborne molecular contamination level; and wherein the ambient control tank comprises:
    (1) a plurality of catalysts, wherein the catalysts comprise a moisture reducing agent, an oxygen reducing agent, an airborne molecular contamination reducing agent, or combinations thereof;
    (2) a regeneration element, wherein the regeneration element heats the ambient control tank to regenerate the plurality of catalysts; and
    (3) a cooling element, wherein the cooling element cools the ambient control tank to enhance the absorbability of the plurality of catalysts.

2. The interface system of claim 1 further comprising at least one heating element coupled to the enclosure.

3. The interface system of claim 1 further comprising a particle filter coupled to the ambient control tank and at least one second valve coupled to the particle filter and ambient control tank.

4. The interface system of claim 1 further comprising at least one ambient control sensor coupled to the enclosure, wherein the at least one ambient control sensor detects levels of moisture, oxygen, airborne molecular contamination, or combinations thereof within the enclosure.

5. A semiconductor manufacturing system that provides a protective, ambient controlled environment, the semiconductor manufacturing system comprising:
    a plurality of process chambers;
    at least one interface system, wherein the interface system includes a first ambient control element, wherein the first ambient control element includes: a plurality of catalysts; a regeneration element operable to regenerate the plurality of catalysts; and a cooling element, operable to cool the first ambient control element;
    at least one carrier, wherein the carrier comprises a second ambient control element, wherein the first ambient control element and the second ambient control element each one of control moisture, oxygen, or airborne molecular contamination in the interface system and the carrier respectively; and a control module coupled to the plurality of process chambers, the at least one interface system, and the at least one carrier.

6. The semiconductor manufacturing system of claim 5 wherein the second ambient control element comprises a second plurality of catalysts, wherein the second plurality of catalysts comprise a moisture reducing agent, an oxygen reducing agent, an airborne molecular contaminate reducing agent, or combinations thereof.

7. The semiconductor manufacturing system of claim 6 wherein the control module communicates with the at least one ambient control sensor.

8. The semiconductor manufacturing system of claim 5 wherein the first ambient control element comprises an ambient control tank, wherein the regeneration element is operable to heat the ambient control tank and the cooling element is operable to cool the ambient control tank.

9. The semiconductor manufacturing system of claim 8 wherein the ambient control tank comprises the regeneration element and the cooling element.

10. The semiconductor manufacturing system of claim 5 wherein the second ambient control element comprises an adsorptive wafer, an adsorptive bag, or a combination thereof.

11. The semiconductor manufacturing system of claim 5 wherein the interface system and the carrier comprise at least one ambient control sensor, wherein the at least one ambient control sensor detects levels of at least one of moisture, oxygen, and airborne molecular contamination.

12. A semiconductor manufacturing system, comprising:
a process chamber;
a carrier operable to hold a plurality of semiconductor wafers;
an interface system coupled to the process chamber and interposing the carrier and the process chamber, wherein the interface system includes:
a first ambient control element disposed in a control tank, wherein the first ambient control element includes:
a catalyst, wherein the catalyst includes a material operable to reduce one of moisture and oxygen in the control tank; and
a regeneration element controlled by a control module, wherein the regeneration element heats the control tank to regenerate the catalyst;
the control module coupled to the interface system wherein the control module determines a mode of the control tank, wherein the mode determines an absorbability of the catalyst.

13. The system of claim 12, wherein the mode is selected from a regeneration mode and an absorption mode, wherein the regeneration mode regenerates the catalyst and the absorption mode enhances an absorption property of the catalyst.

14. The system of claim 12, wherein the regeneration element is turned on by the control module when the catalyst is saturated.

15. The system of claim 12, wherein the first ambient control element further includes:
a cooling element controlled by the control module.

16. The system of claim 15, wherein the control module in an absorption mode turns on the cooling element to enhance the absorbability of the catalyst.

17. The system of claim 12, wherein the catalyst includes at least one of $Na_{86}[(AlO_2)_{86}(SiO_2)_{106}]*H_2O$ catalyst, copper catalyst, and graphite catalyst.

18. The system of claim 12, wherein the system further comprises a plurality of additional catalysts, wherein the plurality of additional catalysts comprise a moisture reducing agent, an oxygen reducing agent, an airborne molecular contamination reducing agent, or combinations thereof.

19. The system of claim 12, wherein the system further comprises an ambient control sensor coupled to the process chamber, wherein the ambient control sensor detects levels of moisture, oxygen, or combinations thereof within the enclosure.

20. The system of claim 19, wherein the ambient control sensor is coupled to the control module.

* * * * *